United States Patent
Blom et al.

(10) Patent No.: US 9,857,823 B2
(45) Date of Patent: *Jan. 2, 2018

(54) PROGRAMMABLE TEMPERATURE COMPENSATED VOLTAGE GENERATOR

(71) Applicant: IXYS Corporation, Milpitas, CA (US)

(72) Inventors: Eric Blom, Wakefield, MA (US); Anatoliy Tsyrganovich, Woodside, CA (US); James Anderson, Gilbert, AZ (US)

(73) Assignee: IXYS Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/081,880

(22) Filed: Mar. 26, 2016

(65) Prior Publication Data

US 2017/0031380 A1 Feb. 2, 2017

Related U.S. Application Data

(63) Continuation of application No. 14/810,998, filed on Jul. 28, 2015, now Pat. No. 9,331,707.

(51) Int. Cl.

| | |
|---|---|
| *H01L 35/00* | (2006.01) |
| *H01L 37/00* | (2006.01) |
| *H03K 3/42* | (2006.01) |
| *H03K 17/78* | (2006.01) |
| *G05F 3/16* | (2006.01) |
| *G05F 3/04* | (2006.01) |
| *H03M 1/10* | (2006.01) |
| *G05F 1/46* | (2006.01) |
| *H03M 1/66* | (2006.01) |

(52) U.S. Cl.
CPC ............. *G05F 3/16* (2013.01); *G05F 1/461* (2013.01); *G05F 3/04* (2013.01); *H03M 1/1047* (2013.01); *H03M 1/66* (2013.01)

(58) Field of Classification Search
CPC .......... G01K 7/01; G01K 3/005; G01K 7/015; G05F 3/30; H01L 23/34
USPC .................................................... 327/512–513
See application file for complete search history.

(56) References Cited

U.S. PATENT DOCUMENTS

| | | | | |
|---|---|---|---|---|
| 6,222,470 | B1 | 4/2001 | Schuelke | ............... 341/119 |
| 6,265,857 | B1* | 7/2001 | Demsky | .......... G05F 3/245 |
| | | | | 323/312 |
| 7,719,341 | B2* | 5/2010 | Fort | ............... G05F 3/30 |
| | | | | 327/513 |
| 2005/0242799 | A1* | 11/2005 | Erdelyi | ............ G05F 3/30 |
| | | | | 323/312 |

(Continued)

*Primary Examiner* — Quan Tra
(74) *Attorney, Agent, or Firm* — Imperium Patent Works; Amir V. Adibi; Daniel Tagliaferri

(57) ABSTRACT

A programmable temperature compensated voltage reference is disclosed. In an exemplary embodiment, an apparatus includes a digital-to-analog converter (DAC) that uses a reference voltage and a code to generate a DAC output voltage. The apparatus also includes a temperature compensator that uses a temperature measurement (T) and the DAC code to generate a temperature compensation signal. The temperature compensation signal is represented by a third order polynomial equation. The apparatus also includes a signal combiner that combines the DAC output voltage and the temperature compensation signal to generate a temperature compensated programmable reference voltage.

20 Claims, 8 Drawing Sheets

(56) References Cited

U.S. PATENT DOCUMENTS

2006/0006858 A1* 1/2006 Chiu ................. G05F 3/262
  323/313
2008/0164938 A1 7/2008 Oberhuber et al. ......... 327/543
2016/0098048 A1* 4/2016 Sharma .............. H03F 3/45744
  327/513

* cited by examiner

PROGRAMMABLE TEMPERATURE COMPENSATED VOLTAGE GENERATOR

CROSS-REFERENCE TO RELATED APPLICATIONS

This application is a continuation of, and claims priority under 35 U.S.C. §120 from, nonprovisional U.S. patent application Ser. No. 14/810,998 entitled "Programmable Temperature Compensated Voltage Generator," filed on Jul. 28, 2015, now U.S. Pat. No. 9,331,707, the subject matter of which is incorporated herein by reference.

TECHNICAL FIELD

The present disclosure relates generally to voltage generators, and more particularly to temperature compensated programmable voltage generators.

BACKGROUND INFORMATION

Solid state programmable voltage generators are subject to temperature dependent output errors. For example, the voltage generator may be formed on a silicon die and the generated voltage changes as the temperature of the die changes. These errors typically include a bow shaped error from a bandgap reference voltage, in addition to gain drift and offset drift errors from both the digital to analog converter (DAC) and output buffer typically used in these generators.

Conventional programmable voltage generators use one of several methods to reduce the bandgap bow error by incorporating temperature compensating circuitry within the bandgap circuit itself. However, these circuits may not completely correct for the effects of temperature and therefore some temperature related error may be included in the bandgap output. Offset and gain errors in the DAC and output buffer are typically trimmed at one temperature by using separate trim circuits. These trim circuits may be implemented using circuit elements that drift with temperature in an attempt to track any known temperature dependent offset or gain errors. Unfortunately, due to the above conditions, the output of conventional programmable voltage generators may still include temperature dependent errors. Thus, a more robust solution is desired.

SUMMARY

A programmable temperature compensated voltage generator is disclosed. The generator uses an on-chip digitizing temperature sensor to measure the die temperature near a bandgap voltage reference circuit. Real time Digital Signal Processing (DSP) is used to continuously compute a third order polynomial correction coefficient. This coefficient is applied to a trim DAC and summed with a DAC output before an output buffer amplifier. By applying the correction after the main DAC, not only the bandgap bow error, but also the offset, offset drift, and gain drift errors from both the DAC and buffer amplifier are corrected.

The foregoing is a summary and thus contains, by necessity, simplifications, generalizations and omissions of detail; consequently it is appreciated that the summary is illustrative only. Still other methods, and structures and details are set forth in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

Reference will now be made in detail to some embodiments of the invention, examples of which are illustrated in the accompanying drawings.

DETAILED DESCRIPTION

Figure 1:
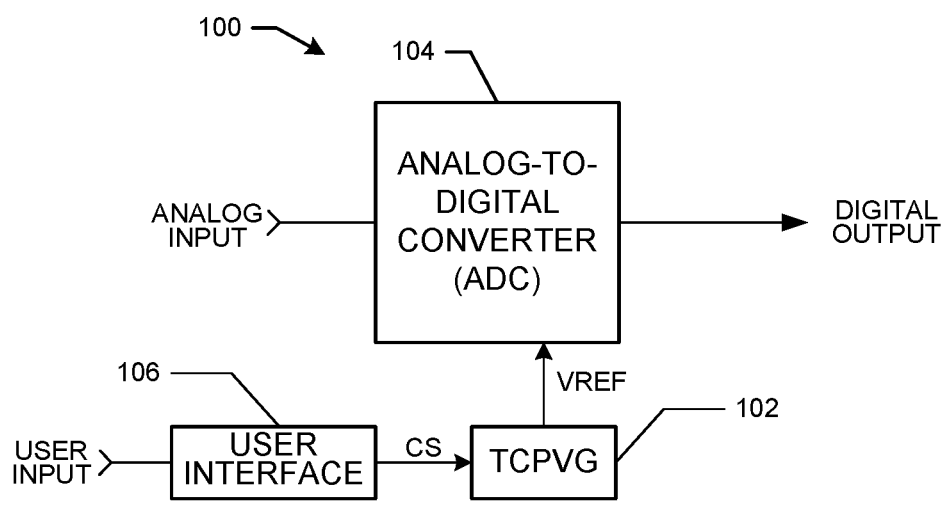
FIG. 1 is a diagram of an analog-to-digital converter that includes an exemplary embodiment of a temperature compensated programmable voltage generator.

FIG. 1 is a diagram of a system 100 that includes an exemplary embodiment of a temperature compensated programmable voltage generator (TCPVG) 102.

The system 100 includes analog-to-digital converter (ADC) 104, TCPVG 102, and user interface 106 that adjusts a gain of the ADC 104. The ADC 104 receives an analog input and generates a digital output indicative of a voltage level of the analog input. During operation, a user sets a gain on a dial of the user interface 106. From the user input, the user interface 106 outputs a control signal CS to the TCPVG 102 to set the gain of the ADC 104. The control signal CS indicates a voltage level of a reference voltage signal to be generated. The TCPVG 102 generates the appropriate reference voltage signal and inputs this signal to the ADC 104. The ADC 104 uses the reference voltage signal VREF to convert the analog input to the appropriate digital output having the desired gain.

In an exemplary embodiment, the TCPVG 102 generates the voltage reference signal VREF to be a temperature compensated signal. For example, the TCPVG 102 measures the temperature of the die (or current environment) and uses this temperature measurement to compensate the reference voltage VREF. Thus, the VREF signal is generated to have the appropriate voltage level independent of temperature variations. A more detailed discussion of the operation of the TCPVG 102 is provided below.

Figure 2:
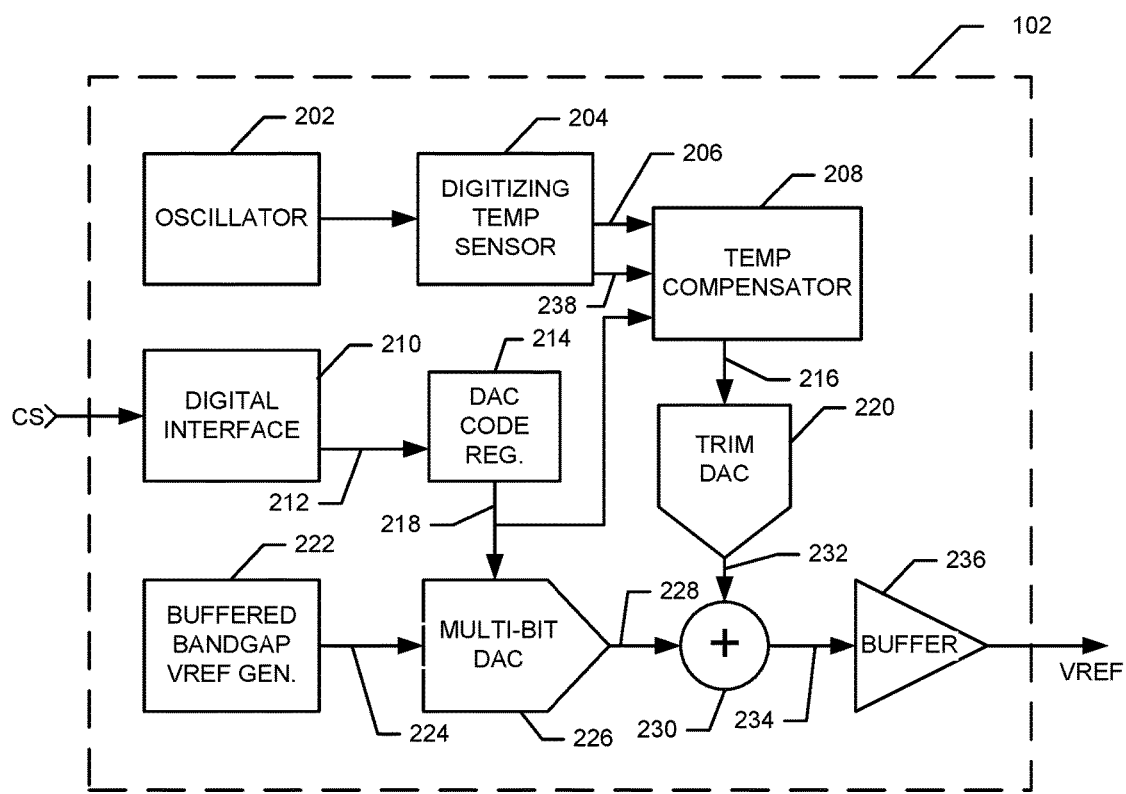
FIG. 2 is an exemplary detailed embodiment of the temperature compensated programmable voltage generator shown in FIG. 1.

FIG. 2 is an exemplary detailed embodiment of the temperature compensated programmable voltage generator 102 shown in FIG. 1. The TCPVG 102 comprises oscillator 202, digitizing temperature sensor 204, temperature compensator 208, digital interface 210, DAC code register 214, trim DAC 220, buffered bandgap reference voltage generator 222, multi-bit DAC 226, signal combiner 230, and output buffer 236.

Digital interface 210 receives the control signal from an external entity, such as from user interface 106 as shown in FIG. 1. The control signal indicates a programmable voltage level of the output voltage VREF to be generated. In response to this control signal the digital interface 210 generates a command 212 that inputs a DAC code value to the DAC code register 214. The DAC code value corresponds to the desired voltage level of the VREF signal. The DAC code value 218 is output from the DAC code register 214 and input to the multi-bit DAC 226. In addition, the buffered bandgap reference voltage generator 222 generates a reference signal 224 at a predetermined voltage level. The reference signal 224 is input to the multi-bit DAC 226. The multi-bit DAC 226 uses the DAC code value 218 to generate a DAC output voltage 228 based on the level of the reference signal 224. Thus, it is possible for the digital interface to control the voltage level output from the multi-bit DAC by providing the appropriate DAC code.

In an exemplary embodiment, the digitizing temperature sensor 204 outputs a measured temperature value 206 that is input to temperature compensator 208. The digitizing temperature sensor 204 also supplies a digital signal STARTH 238 onto temperature compensator 208 indicating that a new temperature has been sensed. Digital signal STARTH 238 is asserted each time digitizing temperature sensor 204 computes a new measured temperature value. The temperature compensator 208 also receives the DAC code 218 that represents the programmable voltage level to be output from the DAC 226. The temperature compensator 208 performs a compensation algorithm to generate a temperature compensation value 216 based a third order polynomial expression. The temperature compensation value 216 is then input to the trim DAC 220. The trim DAC 220 converts the compensation value 216 to an analog compensation signal 232.

In an exemplary embodiment, the signal combiner 230 combines the output 228 of the multi-bit DAC with the compensation signal 232 to generate a compensated output voltage 234. The compensated output voltage 234 is input to buffer 236 that buffers and/or amplifies this signal to generate the programmable output voltage VREF.

In an exemplary embodiment, the temperature compensator 208 performs a compensation algorithm to generate the temperature compensation value 216 that is converted to the compensation signal 232 input to the signal combiner 230. The compensation signal 232 is summed with the DAC output before the output amplifier. By applying the temperature correction after the main DAC (e.g., DAC 226), the bandgap bow error, the offset, offset drift, and gain drift errors for both the DAC 226 and the buffer 236 are corrected.

Figure 3A:
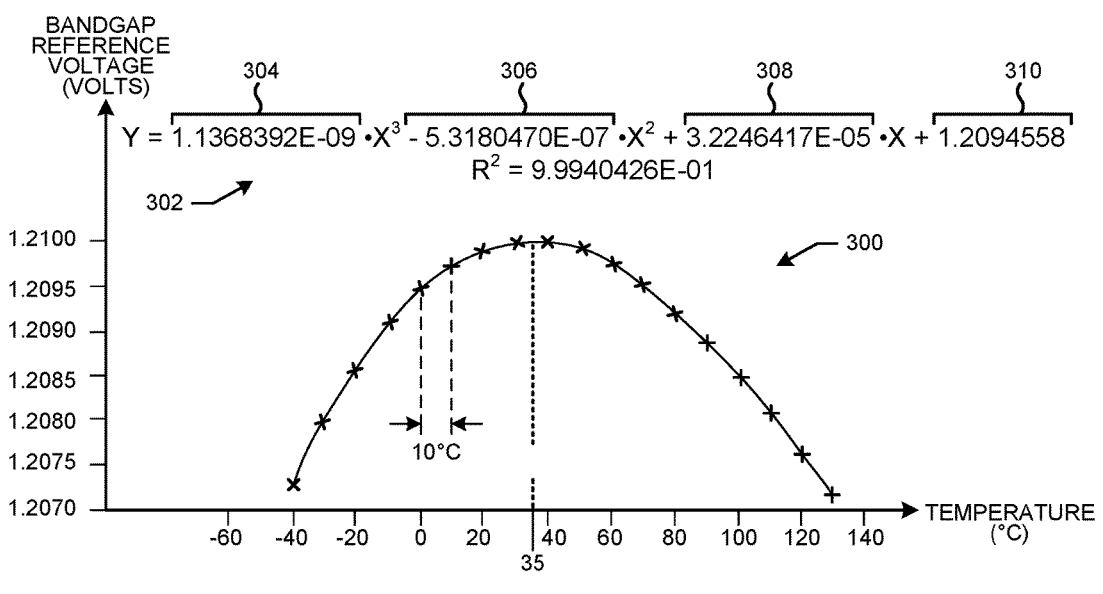
FIG. 3A is a diagram of a plot fitting a third order polynomial expression to a set of measured temperature values.

FIG. 3A is a diagram of a plot 300 fitting a third order polynomial expression to a set of measured temperature values. The received measured temperature values are represented by the "X" markings shown in the plot 300. In this example, the bandgap reference voltage is sampled once every ten degrees. Plot 300 shows how the bandgap reference voltage varies with temperature and includes the bandgap reference voltage in volts along the Y-axis and temperature in degrees Celsius on the X-axis. The generated bandgap reference voltage is temperature dependent. The temperature dependence is well described by a third order polynomial 302 as indicated by a correlation coefficient $R^2$ between the measured temperature values and the fitted curve. In an exemplary embodiment, the correlation coefficient $R^2$ is greater than 0.9994. The third order polynomial 302 has coefficients 304, 306, 308, and 310. Plot 300 is also referred to as the bandgap bow due to the shape of plot 300.

At approximately 35° C., the bandgap reference voltage approaches a maximum where the bandgap reference voltage transitions from a positive slope to a negative slope. At the maximum, the bandgap reference voltage approaches an ideal voltage level and exhibits a near zero temperature coefficient for small changes in temperature. In this exemplary embodiment, the ideal voltage level is 1.21 volts and the zero temperature coefficient temperature was chosen to be 35° C. One of ordinary skill will appreciate that the temperature at which a bandgap reference voltage exhibits a zero temperature coefficient is design dependent and may be different in other embodiments.

Figure 3B:
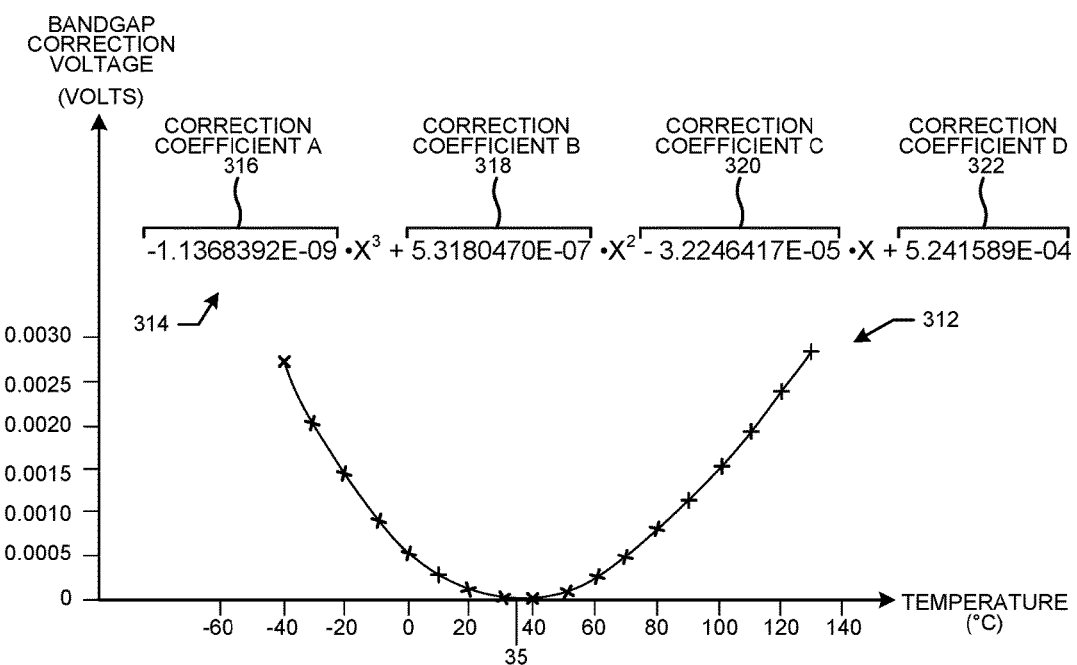
FIG. 3B is a diagram of a plot of a bandgap correction voltage that corrects bandgap reference voltage variation across temperature.

FIG. 3B is a diagram of a plot 312 of a bandgap correction voltage that corrects the bandgap reference voltage variation across temperature. The bandgap correction voltage is determined from the equation set forth below.

$$\text{bandgap corr. volt.} = \text{ideal volt.} - \text{bandgap ref. volt.}$$

If the bandgap correction voltage is generated and added to the bandgap reference voltage, then the resulting sum is the ideal voltage level constant over temperature. Because the bandgap correction voltage is derived from the bandgap reference voltage, the bandgap correction voltage is also well described by a third order polynomial 314, where bandgap correction voltage is expressed as the following equation:

$$\text{bandgap corr. volt.} = A*T^3 + B*T^2 + C*T + D$$

The third order polynomial 314 includes correction coefficient A 316, correction coefficient B 318, correction coefficient C 320, and correction coefficient D 322. In operation, the temperature compensator 208 uses scaled versions of the correction coefficients A, B, C and D to generate the temperature compensation voltage. The scaled versions of the coefficients A, B, C and D are referred to as "trim coefficients". In this example, because the ideal voltage level has been chosen to be 1.21 volts, which is the voltage at the zero temperature coefficient temperature of 35° C., the correction coefficient D 322 (the offset term) is nearly zero.

The correction coefficients A, B, C, and D are obtained by third order polynomial curve fitting to bandgap correction voltage data. The bandgap correction voltage data is collected over at least four temperatures. In one exemplary case, fabricated devices that employ the TCPVG 102 are first tested in a controlled setting at the zero temperature coefficient temperature of 35° C. with temperature compensation disabled. While operating at 35° C., the output voltage at maximum DAC code and at midscale DAC code are measured and fitted to a line to determine a system offset error voltage. The negative of the system offset error voltage is scaled by the least significant bit (LSB) size of the trim DAC 220 to obtain the trim coefficient D. Trim coefficient D is written to EEPROM for permanent storage. The output voltage at maximum DAC code is also temporarily stored in EEPROM to be used to generate the desired correction voltage after more temperatures have been tested.

The devices are tested at two more temperatures, preferably including the negative and positive extremes over which they will be specified. At each temperature the output voltage at the maximum DAC code, with temperature compensation disabled is temporarily stored in EEPROM. At the fourth temperature test, the output voltage at the maximum DAC code is again measured and the past three temperatures are read by the tester. The desired correction voltage is taken by using the voltage measured at 35° C. as the desired constant voltage, such that the bandgap correction voltage=V(at 35° C.)−V(T). The tester computes the third order polynomial fit to the correction voltage, scales the correction coefficients A, B, and C and writes them permanently into EEPROM for use in the temperature compensator 208.

To uniquely derive the third order temperature compensation coefficient A, the devices that employ the TCPVG 102 must be tested at four or more temperatures. However, well designed integrated circuits will be well matched and the computed coefficient A will not vary significantly from unit to unit. In this case the coefficient A is determined from testing of a single initial batch of parts. Coefficient A is reused on every part and only three temperatures need to be tested. Similarly the matching of the circuits may be enough that the second order coefficient B does not vary significantly from unit to unit. In this case the coefficients A and B determined from a single initial batch of tested parts can be reused by all later parts and only two temperatures need to be tested to determine the correction coefficients C and D.

Figure 4:
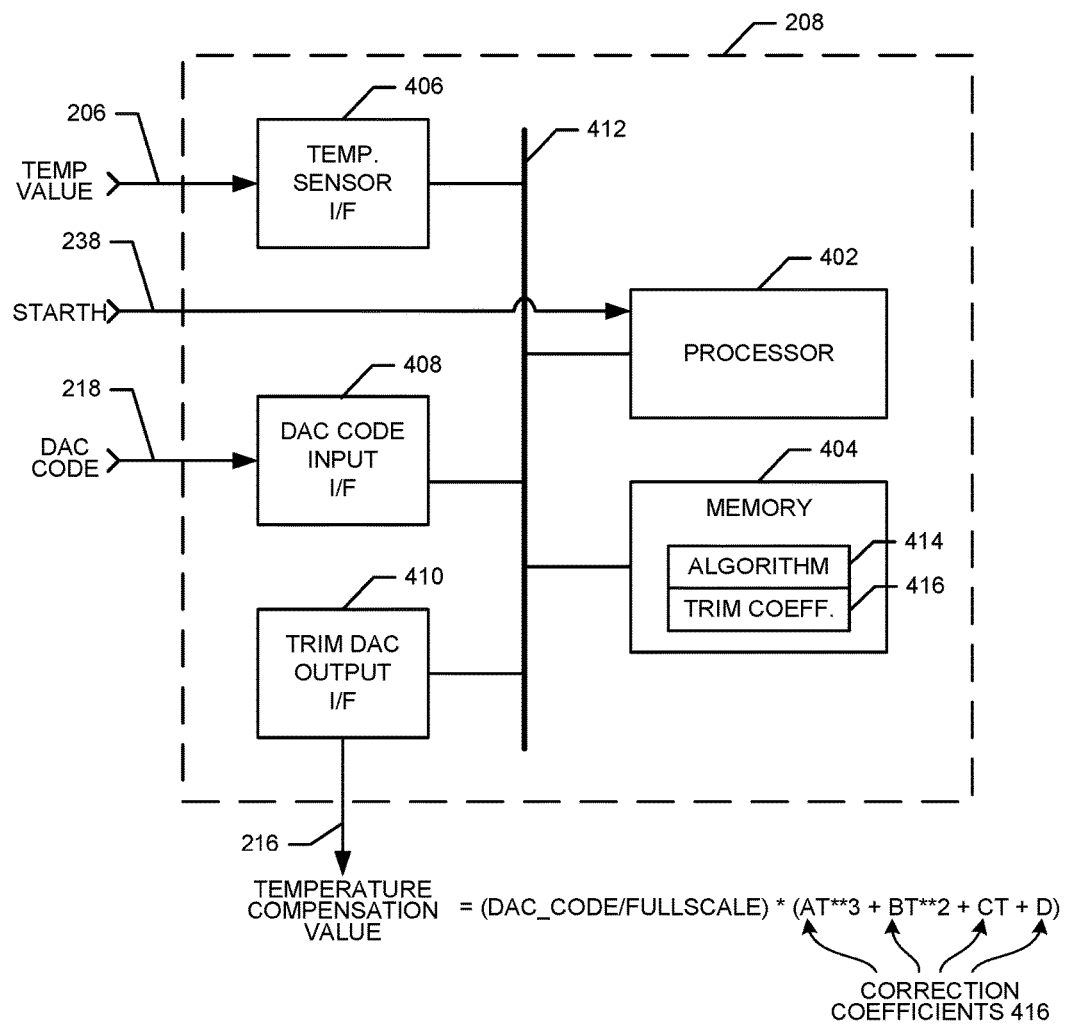
FIG. 4 is an exemplary detailed embodiment of the temperature compensator shown in FIG. 2.

FIG. 4 is an exemplary detailed embodiment of the temperature compensator 208 shown in FIG. 2. In an exemplary embodiment, the temperature compensator 208 includes processor 402, memory 404, temperature sensor interface 406, DAC code input interface 408, trim DAC output interface 410, all connected to communicate using bus 412. In an exemplary embodiment, the memory 404 comprises an algorithm 414, which includes instructions, equations, and data to be executed by the processor to compute temperature compensation values. In addition to the algorithm 414, the memory includes trim coefficients 416 that are used in conjunction with the algorithm 414 to compute the temperature compensation values.

In an exemplary embodiment, the processor 402 comprises at least one of a CPU, state machine, processor, or other computational element that may include memory and/or other hardware resources. The processor 402 operates to process data, execute instructions, and store and retrieve data from the memory 404. The processor 402 also operates to output data and commands using the interfaces 406, 408, and 410.

The memory 404 comprises RAM, ROM, EEPROM, or any other suitable type of memory element. The memory 404 operates to store data, instructions, coefficients, or any other information for use by the temperature compensator 208.

In an exemplary embodiment the temperature sensor interface 406 comprises at least one of analog to digital converters, amplifiers, filters, discrete components, and/or other types of hardware in order to receive a temperature value from the temperature sensor 404.

The temperature value received by the temperature sensor interface 406 is input to the processor 402 and/or the memory 404. The temperature value is used to generate the temperature compensation value. The processor 402 receives the digital signal STARTH 238 that is asserted when a new temperature measurement has been received onto the temperature sensor interface 406.

The DAC code input interface 408 operates to receive a digital DAC code 218 from the DAC code register 214 and passes this DAC code value to the processor 402 and/or the memory 404. The DAC code value is used by the processor 402 to generate temperature compensation values.

The trim DAC output interface 410 operates to output a temperature compensation value 216 generated by the processor 402. The temperature compensation value 216 is passed from the trim DAC output interface 410 to the trim DAC 220.

During operation, the processor 402 receives the temperature measurement and the DAC code associated with the desired voltage output of the programmable voltage generator. The processor 402 performs the algorithm 414 that utilizes the trim coefficients 416 to generate the temperature compensation value. The generated temperature compensation value is then output to the trim DAC 220 using the trim DAC output interface 410. In an exemplary embodiment, the processor 402 executes the algorithm 414 that computes the temperature compensation values using a third degree polynomial expression. For example, in an exemplary embodiment, the polynomial expression can be expressed as follows:

$$\text{Compensation value} = (\text{DAC\_code/fullscale}) * (A*T^3 + B*T^2 + C*T + D)$$

For a main DAC of N bits, fullscale is $2^N$.

In an exemplary embodiment, the trim coefficients are scaled from the ideal correction voltage curve fit:

A=−1.1368392E-09
B=+5.3180470E-07
C=−3.2246417E-05
D=+5.241589E-04

Figure 5:
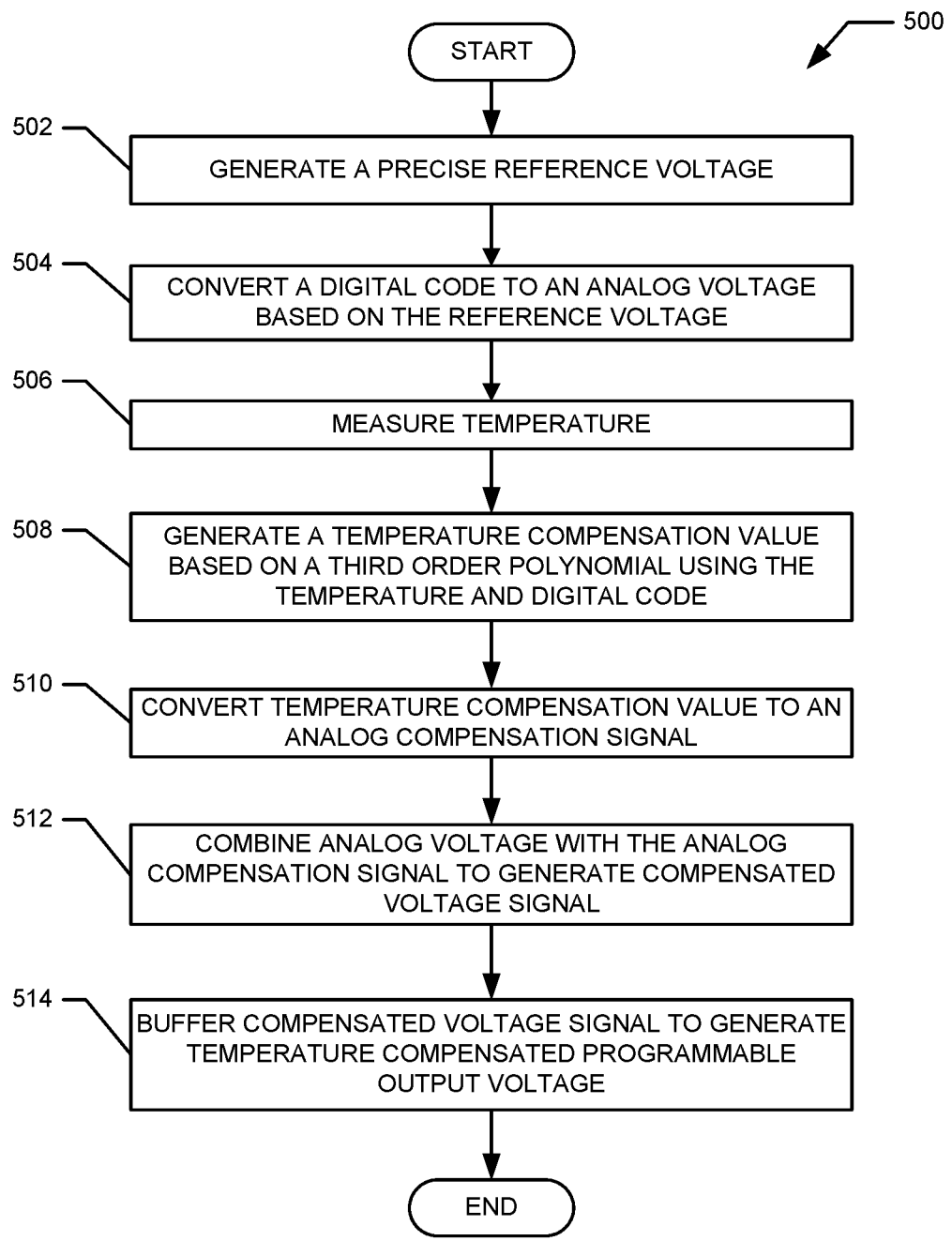
FIG. 5 is an exemplary embodiment of a method for operating the temperature compensated programmable voltage generator to generate a programmable output voltage having reduced temperature dependent errors.

FIG. 5 is an exemplary embodiment of a method 500 for operating the temperature compensated programmable voltage generator to generate a programmable output voltage having reduced temperature dependent errors. For example, the method 500 is suitable for use with the temperature compensated programmable voltage generator 102 shown in FIG. 2.

At block 502, a precise reference voltage is generated. In an exemplary embodiment and the bandgap reference voltage generator 222 operates to generate the precise reference voltage 224.

At block 504, a digital code is converted to analog voltage based on the reference voltage. For example, the digital interface 210 outputs a digital DAC code that is input to the DAC register 214. The DAC register 214 outputs the DAC code to the multi-bit DAC 226. The multi-bit DAC 226 generates the analog voltage 228 based on the received DAC code 218 and the reference voltage 224 received from the band gap reference voltage generator 222.

At block 506, a temperature measurement is taken. In an exemplary embodiment, the temperature sensor 204 takes the temperature measurement and outputs a temperature measurement value 206 to the temperature compensator 208.

At block 508, a temperature compensation value is generated based on a third order polynomial. In an exemplary embodiment, the processor 402 utilizes the temperature measurement received by the temperature sensor interface 406 and the DAC value received by the DAC code interface 408 to perform the algorithm 414 that is stored in the memory 404. The algorithm utilizes the coefficients 416 that are also stored in the memory 404. The algorithm generates the temperature compensation value using a third order polynomial expression as described above.

At block 510, the temperature compensation value is converted to an analog compensation signal. In an exemplary embodiment the processor 402 inputs the temperature compensation value 216 to the trim DAC 220 using the trim DAC interface 410. The trim DAC 220 converts the temperature compensation value 216 to an analog compensation signal 232 and inputs the analog compensation signal 232 to the signal combiner 230.

At block 512, the analog voltage signal 228 output from the DAC 226 is combined with the analog compensation signal 232 output from the trim DAC 220 to generate a temperature compensated voltage signal. In an exemplary embodiment, the signal combiner 230 receives the analog voltage signal 228 and the analog compensation signal 232 output and combines these signals to generate the temperature compensated voltage signal 234.

At block 514, the temperature compensated voltage signal is buffered (and/or amplified) to generate the temperature compensated programmable output voltage (VREF). For example in an exemplary embodiment the output buffer 236 receives the temperature compensated analog signal and outputs the VREF signal.

Thus, the method 500 is suitable for use with the temperature compensated programmable voltage generator 102 to generate a programmable output voltage (VREF) having reduced temperature dependent errors. It should be noted that the operations of the method 500 may be rearranged or modified as would be known to one with skill in the art such that other embodiments are possible.

Figure 6:
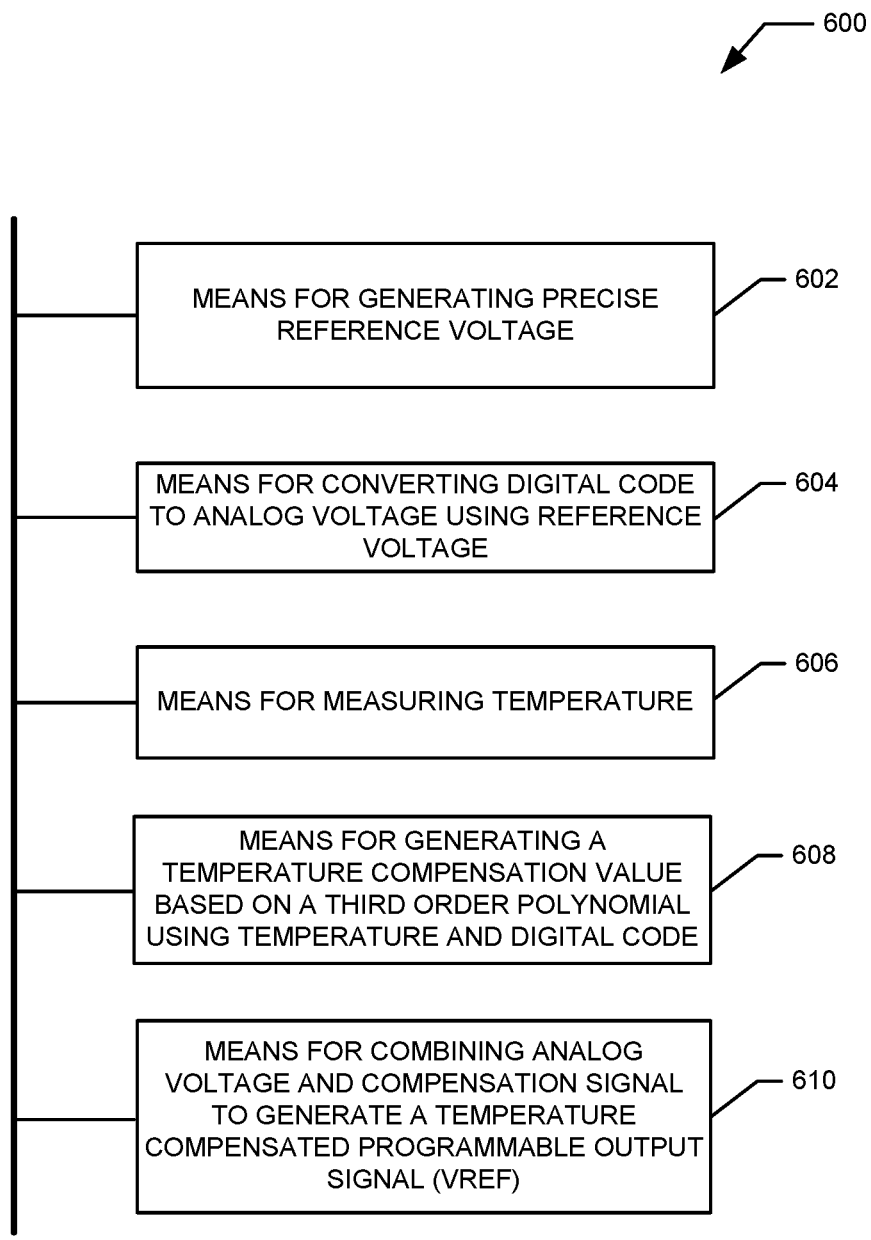
FIG. 6 is an exemplary embodiment of an apparatus for generating a temperature compensated programmable output voltage.

FIG. 6 is an exemplary embodiment of an apparatus 600 for generating a temperature compensated programmable output voltage. For example, in an exemplary embodiment, the apparatus 600 is suitable for use as the temperature compensated programmable voltage generator 102 shown in FIG. 2.

The apparatus 600 comprises a first means 602 for generating a precise reference voltage. For example in an exemplary embodiment, the means 602 comprises the band gap voltage reference 222.

The apparatus 600 also includes a second means 604 converting a digital code to an analog voltage using the reference voltage. In an exemplary embodiment, the means 604 comprises the DAC 226, which receives the reference voltage 224 and the digital code 218 and generates the analog voltage 228.

The apparatus 600 also comprises a third means 606 for measuring temperature. In an exemplary embodiment the temperature sensor 204 measures temperature of the environment and generates the temperature measurement 206 that is input to the temperature compensator 208.

The apparatus 600 also comprises a fourth means 608 for generating a temperature compensation value using a third order polynomial expression. In an exemplary embodiment, the processor 402 receives the temperature measurement and the DAC code and generates the temperature compensation value by performing the algorithm 414 stored in the memory 404. For example, the processor 402 evaluates the third order polynomial expression shown above to generate the temperature compensation value.

The apparatus 600 also comprises a fifth means 610 for combining the analog voltage and the compensation signal to generate a temperature compensated programmable voltage reference (VREF). For example, in an exemplary embodiment the trim DAC converts the compensation value to an analog compensation signal that is input signal combiner 230. The signal combiner 230 combines the analog signal 228 with the analog compensation signal 232 to generate the temperature compensated voltage signal 234. The buffer 236 receives the temperature compensated voltage signal 234 and buffers and/or amplifies this signal to generate the temperature compensated programmable output voltage VREF.

Figure 7:
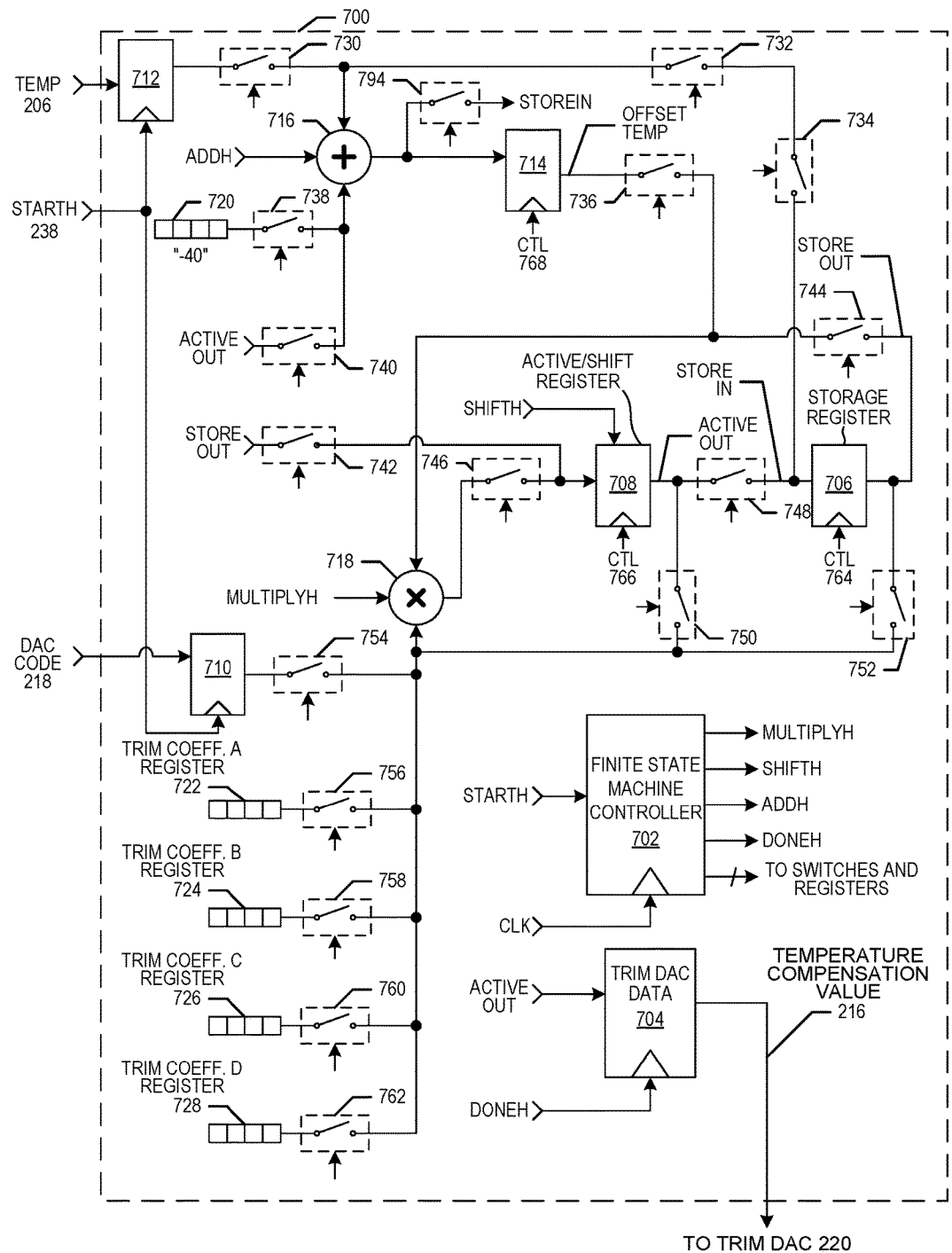
FIG. 7 is an alternative exemplary detailed embodiment of the temperature compensator shown in FIG. 2.

FIG. 7 is an alternative exemplary detailed embodiment of the temperature compensator 208 shown in FIG. 2. In an exemplary embodiment, the temperature compensator 700 includes finite state machine controller 702, trim DAC data register 704, storage register 706, active/shift register 708, DAC code register 710, temperature measurement register 712, sum register 714, adder 716, multiplier 718, temperature offset register 720, trim coefficient A register 722, trim coefficient B register 724, trim coefficient C register 726, trim coefficient D register 728, and switches 730, 732, 734, 736, 738, 740, 742, 744, 746, 748, 750, 752, 754, 756, 758, 760, 762, and 794. The finite state machine controller 702 uses the determined trim coefficients to compute a temperature compensation value 216 that is supplied to trim DAC 220. Although the temperature offset register 720 and the trim coefficient registers 722, 724, 726, and 728 are shown as discrete registers that store values, in another embodiment the values are hardwired in the temperature compensator 700.

The finite state machine controller 702 receives a control signal STARTH from the digitizing temperature sensor indicating that a new digital temperature measurement is available and that a new temperature compensation value 216 is to be determined. The finite state machine controller 702 generates control signal MULTIPLYH, control signal SHIFTH, control signal ADDH, and control signal DONEH. The control signal MULTIPLYH is supplied to the multiplier 718 and controls multiplication operations of the temperature compensator 700. The control signal SHIFTH is supplied to active/shift register 708 and controls operation of the active/shift register 708. The control signal ADDH is supplied to the adder 716 and controls addition operations of the temperature compensator 700. The control signal DONEH indicates when computation of the temperature compensation value 216 is completed. The control signal DONEH is supplied to the trim DAC data register 704 and controls when the computed temperature compensation value 216 is to be supplied to the trim DAC 220.

The finite state machine controller 702 also controls registers 706, 708, and 710. The finite state machine controller 702 generates and supplies control signal 764 to storage register 706. The finite state machine controller 702 generates and supplies control signal 766 to active/shift register 708. The finite state machine controller 702 generates and supplies control signal 768 to register 714. In addition, the finite state machine controller 702 controls the switches 730, 732, 734, 736, 738, 740, 742, 744, 746, 748, 750, 752, 754, 756, 758, 760, 762, and 794 by generating and supplying a control signal to each of the switches. The control signals are represented by lines and arrows extending towards the dashed lines that form the boundaries of the switches. The finite state machine controller 702 uses the stored trim coefficients A, B, C, and D to generate and supply the temperature compensation value 216 to the trim DAC 220.

During operation, the temperature value 206 is received onto temperature measurement register 712. The DAC code 218 is received onto DAC code register 710. The finite state machine controller 702 utilizes the temperature value 206, the DAC code 218, and the trim coefficients A, B, C, and D stored in registers 722, 724, 726, and 728, respectively, to compute the temperature compensation values using a third degree polynomial expression to generate the temperature compensation value 216. The temperature compensation value 216 is passed from the trim DAC data register 704 to the trim DAC 220.

In one exemplary embodiment the trimdac has a code word width of 9-bits. Thus any correction computed that has precision higher than 9-bits will not be converted to analog and summed at the output. It is advantageous to use the shift register portion of the active/shift register 708 to right shift and truncate the results of multiplier 718 such that data word width is limited to the minimum width required to achieve an output word with 9-bits of precision. The finite state machine asserts SHIFTH to right shift the data in the active/shift register after every multiplication at multiplier 718 enough to limit word growth but only enough to limit output precision to 9-bits. The temperature offset register 720 stores a temperature offset value used to minimize the word length. In this example, the temperature offset value is negative forty ("−40"). The multiplication of temperature by itself three times during the A*T^3 computation could result in a very long data word. The use of an offset temperature results in a smaller number denoting the maximum temperature which then results in less word growth.

In another exemplary embodiment the multiplier 718 is formed by more switches and controls from the finite state machine to the adder 716 and shift register 708 to use the existing circuits to implement a shift and add bit serial multiplier.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An apparatus comprising:
    a Digital-to-Analog Converter (DAC) that receives a reference voltage and a digital code, wherein the DAC generates a DAC output voltage;
    a temperature compensator that receives a temperature measurement (T) and the DAC digital code to generate a temperature compensation signal, wherein the temperature compensation signal is represented by a third order polynomial equation; and
    a signal combiner that combines the DAC output voltage and the temperature compensation signal to generate an output signal, wherein the output signal is used to generate a temperature compensated programmable reference voltage.

2. The apparatus of claim 1, further comprising:
    an amplifier that receives the output signal from the signal combiner and generates the temperature compensated programmable reference voltage.

3. The apparatus of claim 1, wherein the DAC has a maximum digital input code (MAX), wherein a temperature compensation value is determined from the third order polynomial equation expressed as [(digital code/(MAX+1))×(A×T^3+B×T^2+C×T+D)], and wherein A, B, C, and D are coefficients.

4. The apparatus of claim 1, further comprising:
    a processor that evaluates the third order polynomial equation to compute the temperature compensation value.

5. The apparatus of claim 1, further comprising:
    a trim DAC that converts the temperature compensation value to the temperature compensation signal.

6. The apparatus of claim 1, further comprising:
    a buffer that buffers the output signal.

7. The apparatus of claim 6, wherein the temperature compensation signal compensates for temperature errors associated with the reference voltage, the DAC, and the buffer and offset errors associated with the reference voltage, the DAC, and the buffer.

8. The apparatus of claim 1, further comprising:
    a bandgap reference voltage generator that generates the reference voltage.

9. The apparatus of claim 1, further comprising:
    a digitizing temperature sensor that generates and supplies the temperature measurement (T) to the temperature compensator, and wherein the DAC, the temperature compensator, and the signal combiner are included within an integrated circuit package.

10. A method comprising:
    converting a digital code to an analog signal based on a reference voltage;
    generating a temperature compensation signal based on a temperature measurement (T) and the digital code, wherein the temperature compensation signal is determined from a third order polynomial equation; and
    combining the signal and the temperature compensation signal to generate an output signal.

11. The method of claim 10, further comprising:
    amplifying the output signal to generate a temperature compensated programmable voltage signal.

12. The method of claim 10, further comprising:
    generating the reference voltage using a bandgap reference voltage generator.

13. The method of claim 10, further comprising:
    evaluating a third order polynomial equation to generate the temperature compensation signal.

14. The method of claim 13, wherein the third order polynomial equation is expressed as [(digital code/(MAX+1))×(A×T^3+B×T^2+C×T+D)], wherein MAX is a maximum value of the digital code, and wherein A, B, C, and D are coefficients.

15. The method of claim 10, wherein the temperature compensation signal compensates for temperature errors associated with the reference voltage and offset errors associated with the operation of converting.

16. An apparatus comprising:
    means for generating a reference voltage;
    means for converting a digital code to an analog voltage using the reference voltage;
    means for generating a temperature compensation signal based on a third order polynomial equation using a temperature value (T) and the digital code; and
    means for combining the analog voltage and the compensation signal to generate an output signal.

17. The apparatus of claim 16, further comprising:
    means for amplifying the output signal generated to generate a temperature compensated programmable reference voltage.

18. The apparatus of claim 16, wherein the means for converting has a maximum digital input code (MAX), wherein the third order polynomial equation is expressed as [(digital code/(MAX+1))×(A×T^3+B×T^2+C×T+D)], and wherein A, B, C, and D are coefficients.

19. The apparatus of claim 18, wherein the means for generating the temperature compensation signal is a processor that evaluates the third order polynomial equation to generate the temperature compensation signal.

20. The apparatus of claim 16, wherein the means for generating the reference voltage is a bandgap reference voltage generator.

* * * * *